United States Patent [19]
Katsui et al.

[11] 4,170,689
[45] Oct. 9, 1979

[54] MAGNETO-OPTIC THIN FILM FOR MEMORY DEVICES

[75] Inventors: Akinori Katsui; Kazumichi Egashira, both of Mito, Japan

[73] Assignee: Nippon Telegraph and Telephone Public Corporation, Tokyo, Japan

[21] Appl. No.: 811,127

[22] Filed: Jun. 28, 1977

Related U.S. Application Data

[63] Continuation-in-part of Ser. No. 642,491, Dec. 19, 1975, abandoned.

[30] Foreign Application Priority Data

Dec. 25, 1974 [JP] Japan .................................. 49-3601
Sep. 29, 1975 [JP] Japan .............................. 50-117499

[51] Int. Cl.$^2$ ............................................. H01F 10/02
[52] U.S. Cl. ................................. 428/457; 427/128; 427/130; 427/131; 427/132; 428/900

[58] Field of Search ................................. 427/127–132, 427/48; 252/62.54; 75/134 D, 134 M, 170, 161, 153; 428/900, 457, 433, 446

[56] References Cited
PUBLICATIONS

Street et al., Solid State Com., vol. 14, pp. 33–36, 1974.

*Primary Examiner*—Bernard D. Pianalto
*Attorney, Agent, or Firm*—Frishauf, Holtz, Goodman & Woodward

[57] ABSTRACT

A magneto-optic thin film for memory devices, having a composition defined by the formula $$Mn_x(Cu_{1-y'}Ni_{y'})_yBi_z$$

wherein $x+y+z=1$, $0.15 \leq x \leq 0.70$, $0.10 \leq y \leq 0.55$, $0.11 \leq z \leq 0.55$ and $0 < y' < 1$. The properties of the film are further improved by adding Ti, V, Cr, Fe, Nb, Te, Y, Ce, Nd, Gd, Dy, Co, Pd or Rh.

13 Claims, 5 Drawing Figures

MAGNETO-OPTIC THIN FILM FOR MEMORY DEVICES

RELATED APPLICATION

This application is a continuation-in-part of our application Ser. No. 642,491, filed Dec. 19, 1975 and now abandoned.

BACKGROUND OF THE INVENTION

This invention relates to a magneto-optic thin film for memories composed of four or five elements.

Among the conventional magneto-optic thin films for memories, a Mn-Bi film is most prominent in readout efficiency. The film performs a memory function in the following manner. First of all, a laser beam is irradiated to a micro region of the film magnetized in advance in a direction perpendicular to the surface of the film. The micro region receiving the laser beam absorbs the light energy of the beam to raise the temperature of the micro region. When the temperature exceeds a Curie point, the micro region is demagnetized. Then, the laser beam irradiation is stopped. This causes the temperature of the micro region to lower below the Curie point, resulting in magnetization in the opposite direction to that of the other resions of the film. This process is called a writing by Curie point method.

The performance of a magneto-optic thin film for memories is evaluated from the points of its writing power and its readout signal-to-noise ratio. In the case of Curie point method, the magnitude of writing power is proportional to the difference between a room temperature and a Curie point of the film. It follows that the writing power of a magneto-optic thin film having a low Curie point is small. A small writing power is an absolute requisite for a magneto-optic thin film. On the other hand, a magneto-optic figure of merit $2F/\alpha$, "F" denoting a Faraday rotation angle for a unit thickness of the film and "$\alpha$" representing a light absorption coefficient, constitutes a parameter for evaluating a readout signal-to-noise ratio of the film. A large value of $2F/\alpha$ is also absolutely required for a magneto-optic thin film.

J. Appl. Phys. Vol. 43, p. 2875 (1972) discloses a magneto-optic thin film of Mn-Bi-Ti system. Further, Solid State Communication Vol. 14, p. 33 (1974) teaches systems of $Mn_5Ni_2Bi_4$ and $Mn_3Cu_4Bi_4$. These substances have relatively low Curie points.

SUMMARY OF THE INVENTION

An object of this invention is to provide a magneto-optic thin film acting as a preferred memory medium.

Another object is to provide a magneto-optic thin film having a low Curie point.

Still another object is to provide a magneto-optic thin film exhibiting a good magneto-optic performance.

Still another object is to provide a magneto-optic thin film having a good magnetic hysteresis characteristic.

Still another object is to provide a magneto-optic thin film free from phase transformation and chemically stable.

Still another object is to provide a method for producing a magneto-optic thin film with good reproducibility.

A magneto-optic thin film according to this invention has a composition defined by the formula $Mn_x(Cu_{1-y'}Ni_{y'})_yBi_z$ wherein $x+y+z=1$, $0.15 \leq x \leq 0.70$, $0.10 \leq y \leq 0.55$, $0.11 \leq z \leq 0.55$ and 0.55 and $0 < y' < 1$. The composition thus defined enables the product thin film to have a single phase of cubic structure. A more preferred composition can be obtained if the conditions of the above formula are changed to $0.20 \leq x \leq 0.55$, $0.15 \leq y \leq 0.45$ and $0.13 \leq z \leq 0.43$ with the other conditions left unchanged.

Further addition of Ti, V, Cr, Fe, Nb, Te, Y, Ce, Nd, Gd or Dy to the above composition of the four element system enables the product film to bear an increased rectangularity ratio Mr/Ms of the magnetic hysteresis loop, "Mr" and "Ms" respectively representing a residual and a saturation magnetization value. Likewise, the addition of Co, Pd or Rh to the four element system enables the product film to bear a lowered Curie point.

DETAILED DESCRIPTION OF THE INVENTION

A magneto-optic thin film of this invention can be obtained by a vacuum deposition or a sputtering method using a substrate of glass, fused quartz, mica or aluminum plate coated with silicon monoxide or silicon dioxide. Let it be assumed that a thin film of Mn-Cu-Ni-Bi system is formed by a vacuum deposition method on a micro sheet glass sized at 2cm×2cm×0.5mm and available from Corning Glass Works of U.S.A. In this case, the amount of these elements is determined first. After one Bi layer has been deposited on the sheet glass, Mn, Cu and Ni are deposited simultaneously from a single source or alternately from separate sources to form 3 to 5 layers of these metals upon the Bi layer, followed by forming atop these layers several thousands of angstrom (Å) units in thickness of a protection film of SiO. Finally, the resultant mass is subjected to annealing at 300° to 400° C. for several hours for the purpose of diffusion. The layer made of Mn, Cu, Ni and Bi can be optionally adjusted to have any thickness over 200 Å. The protection film, which is not necessarily required for the formation of a magneto-optic thin film, is intended to improve the optical properties of the film. For instance, the protection film serves to prevent the reflection of light. It suffices to set a degree of vacuum at $1 \times 10^{-6}$ Torr or less at the time of deposition and annealing.

In the case of a sputtering method, for example, a direct current sputtering method, atoms of elements constituting a magneto-optic thin film are emitted from targets under a vacuum degree of $1.3 \times 10^{-1}$ Torr so as to form a desired thickness of film on a fused quartz substrate sufficiently cooled in advance with liquefied nitrogen, followed by annealing at a vacuum degree of $1\times 10^{-6}$ Torr so as to obtain ferromagnetization.

The deposition order of the four basic elements Mn, Cu, Ni, Bi with or without an additive of Ti, V, Cr, Fe, Nb, Te, Y, Ce, Nd, Gd, Dy, Co, Pd or Rh does not give a substantial influence to the product thin film. Namely, whatever the deposition order may be, the product thin film bears substantially the same properties. This applies to vacuum deposition and sputtering methods.

Table 1 shows the Curie temperatures $T_c$ (°C.) and the magneto-optic figure of merits $2F/\alpha$ of thin film samples 1 to 29, each 400 Å thick, of a Mn-Cu-Ni-Bi system formed on micro sheet glasses of Corning Glass Works, U.S.A., by vacuum deposition method. A laser beam having a wavelength of 6328 Å was used for determining the values of $2F/\alpha$. It is seen that samples 3, 9, 20, 21, 26, 27, 28 and 29 have compositions falling outside the range specified in this invention. In these samples, crystalline phases other than cubic structure were found existing together with cubic system. Also the values of $2F/\alpha$ of these samples were small.

The compositions of all the remaining samples fall within the range specified in this invention. It was also seen that these remaining samples had a single phase of cubic structure, large values of $2F/\alpha$ and preferred values of Curie points.

Described in the following as an example is the manufacturing method of sample 16 of Table 1 having a composition of $Mn_{0.33}(Cu_{0.80}Ni_{0.20})_{0.33}Bi_{0.34}$.

EXAMPLE

Five substrates each of five kinds of material, totalling 25 substrates, were disposed on substrate holders of a vacuum deposition apparatus. Specifically, the substrate used was made of glass, fused quartz, mica, aluminum plate coated with SiO and aluminum plate coated with $SiO_2$ about 1μm thick. Each substrate was sized at 20mm ×20mm ×0.1 to 1mm.

For the purpose of deposition, a conical basket heater using a tungsten wire, a chimney type heater and two electron guns were provided in the deposition apparatus. One of the two electron guns was of one-hearth type and the other of three-hearth type. It follows that the deposition apparatus was capable of depositing six kinds of material in situ.

During deposition and annealing steps, the base plate supporting the substrate holders was rotated at a speed of 2 to 10 rpm and the deposition apparatus was evacuated to a vacuum of less than $1\times 10^{-6}$ Torr.

Bi was first deposited on the substrate using the conical basket heater to form a layer 240 Å thick, the layer growing rate being 2 to 5 Å/second. Then, Mn, Cu and Ni were successively deposited on the Bi layer. The one-hearth type electron gun was used for the Mn deposition to form a layer 82 Å thick, the layer growing rate being 0.2 to 0.5 Å/second. On the other hand, Cu and Ni were deposited by using the three-hearth type electron gun to form a Cu layer 63 Å thick at a rate of 0.2 to 0.5 Å/second and a Ni layer 14 Å thick at a rate of 0.2 to 0.5 Å/second respectively. Finally, a SiO layer about 3000 Å thick was formed on the Ni layer at a rate of about 3 Å/second, using the chimney type heater.

The substrate thus coated was heated to 400° C. at a rate of about 3° C./min. for effecting annealing for about 8 hours, followed by cooling at a rate of about 4° C./min.

The thickness of each deposited layer was measured by a quartz crystal thickness monitor produced by Solan Inc.

The other samples were prepared substantially in the same manner as for sample 16.

Table 2 shows the magnetic hysteresis characteristics, namely, coercive force $H_c$ and rectangularity ratio Mr/Ms of magneto-optic thin films (samples 30 to 73) prepared by adding another element "M" selected from the group consisting of Ti, V, Cr, Fe, Nb, Te, Y, Ce, Nd, Gd and Dy to the basic four element system of Mn-Cu-Ni-Bi. All the thin films shown in Table 2, each having a thickness of 400 A, were formed on glass substrates (micro sheet glass by Corning Glass Works, U.S.A.). Table 2 also shows the magnetic hysteresis characteristics of samples 12, 13, 14 and 15 shown in Table 1 as examples of thin films without an additive "M" for the purpose of comparison. Samples 30 to 73 were prepared substantially in the same manner as for samples 1 to 29, except that the deposition order of Mn, Cu, Ni, Bi and the additive "M" was optionally changed.

Table 2 shows that the magnetic hysteresis characteristics of the thin films made of five element system of Mn-Cu-Ni-Bi-M are better than those of four element system of Mn-Cu-Ni-Bi. For example, sample 35 prepared by adding 0.07 mol of vanadium to 1 mol of sample 13 had 2.0 KOe of coercive force Hc and 1.0 of rectangularity ratio Mr/Ms in contrast to sample 13 having 1.2 KOe of Hc and 0.7 of Mr/Ms.

Table 3 shows the Curie temperatures Tc of samples 74, 75 and 76 prepared by adding Co, Pd or Rh to the four element system of Mn-Cu-Ni-Bi. Also shown are control cases where the additive was not used. The samples shown in Table 3 were prepared substantially in the same manner as for the samples of Table 2. It is seen that Co, Pd and Rh are very effective for lowering the Curie temperature of a magneto-optic thin film.

Table 1

| Sample No. | $Mn_x(Cu_{1-y'}Ni_{y'})_yBi_z$ | | | | Curie Temperature (°C.) | Magneto-optic Figure of Merit (Degree) 2F/d |
|---|---|---|---|---|---|---|
| | x | y | y' | z | | |
| 1 | 0.64 | 0.14 | 0.40 | 0.22 | 120 | 0.43 |
| 2 | 0.61 | 0.12 | 0.44 | 0.27 | 122 | 0.45 |
| 3 | 0.50 | 0.40 | 0.40 | 0.10 | 126 | 0.20 |
| 4 | 0.50 | 0.30 | 0.40 | 0.20 | 147 | 0.87 |
| 5 | 0.50 | 0.20 | 0.20 | 0.30 | 148 | 0.83 |
| 6 | " | " | 0.44 | " | 122 | 0.68 |
| 7 | " | " | 0.60 | " | 116 | 0.61 |
| 8 | " | " | 0.80 | " | 107 | 0.54 |
| 9 | 0.47 | 0.08 | 0.40 | 0.45 | 135 | 0.15 |
| 10 | 0.41 | 0.41 | 0.44 | 0.18 | 137 | 0.57 |
| 11 | 0.40 | 0.20 | 0.40 | 0.40 | 130 | 0.60 |
| 12 | 0.38 | 0.30 | 0.11 | 0.32 | 186 | 1.10 |
| 13 | " | " | 0.14 | " | 182 | 1.06 |
| 14 | " | " | 0.21 | " | 159 | 0.94 |
| 15 | " | " | 0.40 | " | 135 | 0.71 |
| 16 | 0.33 | 0.33 | 0.20 | 0.34 | 187 | 1.13 |
| 17 | " | " | 0.44 | " | 137 | 0.79 |
| 18 | " | " | 0.60 | " | 125 | 0.65 |
| 19 | " | " | 0.80 | " | 118 | 0.60 |
| 20 | 0.31 | 0.07 | 0.20 | 0.62 | 185 | 0.20 |
| 21 | " | " | 0.40 | " | 165 | 0.15 |
| 22 | 0.26 | 0.37 | 0.44 | 0.37 | 167 | 0.80 |
| 23 | 0.25 | 0.25 | 0.20 | 0.50 | 182 | 1.07 |
| 24 | " | " | 0.80 | " | 122 | 0.80 |
| 25 | " | " | 0.95 | " | 100 | 0.80 |
| 26 | 0.20 | 0.60 | 0.10 | 0.20 | 182 | 0.33 |
| 27 | " | " | 0.40 | " | 142 | 0.25 |

Table 1-continued

| Sample No. | $Mn_x(Cu_{1-y'}Ni_{y'})_y Bi_z$ | | | | Curie Temperature (°C.) | Magneto-optic Figure of Merit (Degree) 2F/d |
|---|---|---|---|---|---|---|
| | x | y | y' | z | | |
| 28 | 0.11 | 0.33 | 0.10 | 0.56 | 185 | 0.22 |
| 29 | " | " | 0.40 | " | 128 | 0.08 |

Table 2

| Sample No. | Additive | Film Composition | Coercive Force Hc(KOe) | Rectangularity Ratio Mr/Ms |
|---|---|---|---|---|
| 12 | | $Mn_{0.38}(Cu_{0.89}Ni_{0.11})_{0.30}Bi_{0.32}$ | 1.2 | 0.7 |
| 13 | | $Mn_{0.38}(Cu_{0.86}Ni_{0.14})_{0.30}Bi_{0.32}$ | 1.2 | 0.7 |
| | None | | | |
| 14 | | $Mn_{0.38}(Cu_{0.79}Ni_{0.21})_{0.30}Bi_{0.32}$ | 1.1 | 0.65 |
| 15 | | $Mn_{0.38}(Cu_{0.60}Ni_{0.40})_{0.30}Bi_{0.32}$ | 1.0 | 0.6 |
| 30 | | $Mn_{0.38}(Cu_{0.86}Ni_{0.14})_{0.30}Bi_{0.32}:Ti_{0.035}$ | 1.5 | 1.0 |
| 31 | | $Mn_{0.38}(Cu_{0.86}Ni_{0.14})_{0.30}Bi_{0.32}:Ti_{0.07}$ | 1.9 | 1.0 |
| | Ti | | | |
| 32 | | $Mn_{0.38}(Cu_{0.60}Ni_{0.40})_{0.30}Bi_{0.32}:Ti_{0.35}$ | 1.3 | 0.95 |
| 33 | | $Mn_{0.38}(Cu_{0.60}Ni_{0.40})_{0.30}Bi_{0.32}:Ti_{0.07}$ | 1.4 | 1.0 |
| 34 | | $Mn_{0.38}(Cu_{0.86}Ni_{0.14})_{0.30}Bi_{0.32}:V_{0.035}$ | 1.5 | 1.0 |
| 35 | | $Mn_{0.38}(Cu_{0.86}Ni_{0.14})_{0.30}Bi_{0.32}:V_{0.07}$ | 2.0 | 1.0 |
| | V | | | |
| 36 | | $Mn_{0.38}(Cu_{0.60}Ni_{0.40})_{0.30}Bi_{0.32}:V_{0.035}$ | 1.3 | 1.0 |
| 37 | | $Mn_{0.38}(Cu_{0.60}Ni_{0.40})_{0.30}Bi_{0.32}:V_{0.07}$ | 1.5 | 1.0 |
| 38 | | $Mn_{0.38}(Cu_{0.86}Ni_{0.14})_{0.30}Bi_{0.32}:Cr_{0.035}$ | 1.3 | 1.0 |
| 39 | | $Mn_{0.38}(Cu_{0.86}Ni_{0.14})_{0.30}Bi_{0.32}:Cr_{0.07}$ | 1.6 | 1.0 |
| | Cr | | | |
| 40 | | $Mn_{0.38}(Cu_{0.60}Ni_{0.40})_{0.30}Bi_{0.32}:Cr_{0.035}$ | 1.2 | 1.0 |
| 41 | | $Mn_{0.38}(Cu_{0.60}Ni_{0.40})_{0.30}Bi_{0.32}:Cr_{0.07}$ | 1.4 | 1.0 |
| 42 | | $Mn_{0.38}(Cu_{0.86}Ni_{0.14})_{0.30}Bi_{0.32}:Fe_{0.035}$ | 1.2 | 0.95 |
| 43 | | $Mn_{0.38}(Cu_{0.86}Ni_{0.14})_{0.30}Bi_{0.32}:Fe_{0.07}$ | 1.6 | 0.95 |
| | Fe | | | |
| 44 | | $Mn_{0.38}(Cu_{0.60}Ni_{0.40})_{0.30}Bi_{0.32}:Fe_{0.035}$ | 1.1 | 0.90 |
| 45 | | $Mn_{0.38}(Cu_{0.60}Ni_{0.40})_{0.30}Bi_{0.32}:Fe_{0.07}$ | 1.3 | 0.90 |
| 46 | | $Mn_{0.38}(Cu_{0.86}Ni_{0.14})_{0.30}Bi_{0.32}:Nb_{0.035}$ | 1.5 | 1.0 |
| 47 | | $Mn_{0.38}(Cu_{0.86}Ni_{0.14})_{0.30}Bi_{0.32}:Nb_{0.07}$ | 1.9 | 1.0 |
| | Nb | | | |
| 48 | | $Mn_{0.38}(Cu_{0.60}Ni_{0.40})_{0.30}Bi_{0.32}:Nb_{0.035}$ | 1.3 | 0.95 |
| 49 | | $Mn_{0.38}(Cu_{0.60}Ni_{0.40})_{0.30}Bi_{0.32}:Nb_{0.07}$ | 1.4 | 1.0 |
| 50 | | $Mn_{0.38}(Cu_{0.79}Ni_{0.21})_{0.30}Bi_{0.32}:Te_{0.03}$ | 2.0 | 1.0 |
| 51 | | $Mn_{0.38}(Cu_{0.79}Ni_{0.21})_{0.30}Bi_{0.32}:Te_{0.06}$ | 2.0 | 1.0 |
| 52 | | $Mn_{0.38}(Cu_{0.60}Ni_{0.40})_{0.30}Bi_{0.32}:Te_{0.03}$ | 1.5 | 0.95 |
| | Te | | | |
| 53 | | $Mn_{0.38}(Cu_{0.60}Ni_{0.40})_{0.30}Bi_{0.32}:Te_{0.06}$ | 1.6 | 1.0 |
| 54 | | $Mn_{0.38}(Cu_{0.89}Ni_{0.11})_{0.30}Bi_{0.32}:Y_{0.075}$ | 1.4 | 0.95 |
| 55 | | $Mn_{0.38}(Cu_{0.89}Ni_{0.11})_{0.30}Bi_{0.32}:Y_{0.15}$ | 1.8 | 0.95 |
| | Y | | | |
| 56 | | $Mn_{0.38}(Cu_{0.60}Ni_{0.40})_{0.30}Bi_{0.32}:Y_{0.075}$ | 1.3 | 0.90 |
| 57 | | $Mn_{0.38}(Cu_{0.60}Ni_{0.40})_{0.30}Bi_{0.32}:Y_{0.15}$ | 1.5 | 0.95 |
| 58 | | $Mn_{0.38}(Cu_{0.89}Ni_{0.11})_{0.30}Bi_{0.32}:Ce_{0.075}$ | 1.3 | 0.90 |
| 59 | | $Mn_{0.38}(Cu_{0.89}Ni_{0.11})_{0.30}Bi_{0.32}:Ce_{0.15}$ | 1.8 | 0.90 |
| | Ce | | | |
| 60 | | $Mn_{0.38}(Cu_{0.60}Ni_{0.40})_{0.30}Bi_{0.32}:Ce_{0.075}$ | 1.1 | 0.90 |
| 61 | | $Mn_{0.38}(Cu_{0.70}Ni_{0.30})_{0.30}Bi_{0.32}:Ce_{0.15}$ | 1.2 | 0.90 |
| 62 | | $Mn_{0.38}(Cu_{0.89}Ni_{0.11})_{0.30}Bi_{0.32}:Nd_{0.075}$ | 1.8 | 1.0 |
| 63 | | $Mn_{0.38}(Cu_{0.89}Ni_{0.11})_{0.30}Bi_{0.32}:Nd_{0.15}$ | 2.3 | 1.0 |
| | Nd | | | |
| 64 | | $Mn_{0.38}(Cu_{0.60}Ni_{0.40})_{0.30}Bi_{0.32}:Nd_{0.075}$ | 1.5 | 1.0 |
| 65 | | $Mn_{0.38}(Cu_{0.60}Ni_{0.40})_{0.30}Bi_{0.32}:Nd_{0.15}$ | 1.7 | 1.0 |
| 66 | | $Mn_{0.38}(Cu_{0.89}Ni_{0.11})_{0.30}Bi_{0.32}:Gd_{0.075}$ | 1.4 | 0.95 |
| 67 | | $Mn_{0.38}(Cu_{0.89}Ni_{0.11})_{0.30}Bi_{0.32}:Gd_{0.15}$ | 1.9 | 0.95 |
| | Gd | | | |
| 68 | | $Mn_{0.38}(Cu_{0.60}Ni_{0.40})_{0.30}Bi_{0.32}:Gd_{0.075}$ | 1.3 | 0.90 |
| 69 | | $Mn_{0.38}(Cu_{0.60}Ni_{0.40})_{0.30}Bi_{0.32}:Gd_{0.15}$ | 1.5 | 0.90 |
| 70 | | $Mn_{0.38}(Cu_{0.89}Ni_{0.11})_{0.30}Bi_{0.32}:Dy_{0.075}$ | 1.8 | 1.0 |
| 71 | | $Mn_{0.38}(Cu_{0.89}Ni_{0.11})_{0.30}Bi_{0.32}:Dy_{0.15}$ | 2.4 | 1.0 |
| | Dy | | | |
| 72 | | $Mn_{0.38}(Cu_{0.60}Ni_{0.40})_{0.30}Bi_{0.32}:Dy_{0.075}$ | 1.6 | 1.0 |
| 73 | | $Mn_{0.38}(Cu_{0.60}Ni_{0.40})_{0.30}Bi_{0.32}:Dy_{0.15}$ | 1.8 | 1.0 |

Table 3

| Sample No. | Additive | Film Composition | Curie Temperature (°C.) | Curie Temp. TC (°C.) without Additive (Control cases) |
|---|---|---|---|---|
| 74 | Co | $Mn_{0.38}(Cu_{0.86}Ni_{0.14})_{0.30}Bi_{0.32}:Co_{0.07}$ | 165 | 187 |
| 75 | Pd | $Mn_{0.38}(Cu_{0.75}Ni_{0.25})_{0.23}Bi_{0.39}:Pd_{0.14}$ | 120 | 190 |

Table 3-continued

| Sample No. | Additive | Film Composition | Curie Temperature (°C.) | Curie Temp. TC (°C.) without Additive (Control cases) |
|---|---|---|---|---|
| 76 | Rh | $Mn_{0.35}(Cu_{0.89}Ni_{0.11})_{0.28}Bi_{0.38}:Rh_{0.07}$ | 140 | 200 |

A humidity resistance test was conducted on a magneto-optic thin film according to this invention. Namely, a thin film of this invention was allowed to stand at a relative humidity of 50% at 50° C. for 24 hours, followed by microscopic observation of the film. No change was observed in the film surface. Another test was conducted at a relative humidity of 90% at 50° C. for 24 hours, with no change in the film surface observed in a subsequent microscopic observation.

Figure 1:
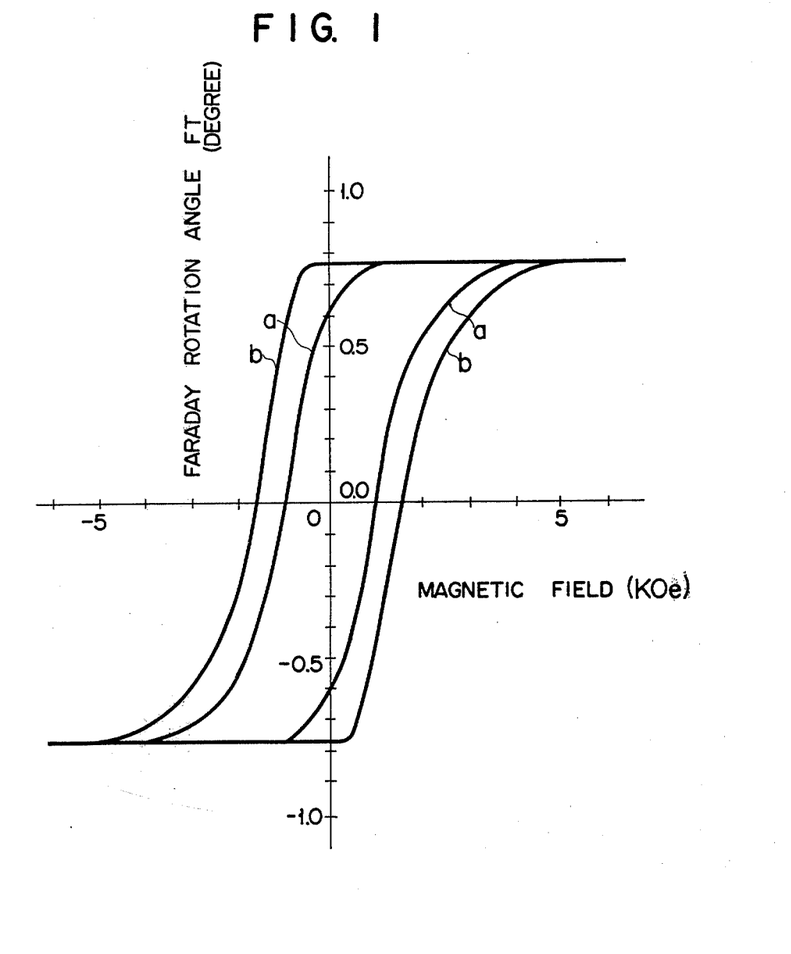
FIG. 1 shows magnetic hysteresis loops of a magneto-optic thin film of this invention having a composition of $Mn_{0.33}(Cu_{0.80}Ni_{0.20})_{0.33}Bi_{0.34}$ and coated on different substrates.

Referring to the appended drawings, FIG. 1 shows magnetic hysteresis loops of sample 16 shown in Table 1 having a composition of $$Mn_{0.33}(Cu_{0.80}Ni_{0.20})_{0.33}Bi_{0.34}$$

In view of the fact that magnetization is proportional to Faraday rotatopm angles Ft, "F" representing a Faraday rotation angle for a unit thickness of the film and "t" denoting a thickness (400 Å) of the film, the values of Ft determined by using a laser beam having a wavelength of 6328 Å are plotted on the ordinate. Loops (a) and (b) shown in FIG. 1 denote that the thin films were formed on the substrates of glass and fused quartz, respectively. The rectangularity ratio Mr/Ms for loop (a) for the case of glass substrate is smaller than 1.0, whereas the value for loop (b) for the fused quartz case is substantially equal to 1.0. This implies that the present invention permits the value of Mr/Ms constituting an important characteristic of a magneto-optic memory film to reach 1.0 through appropriate selection of the substrate.

Figure 2:
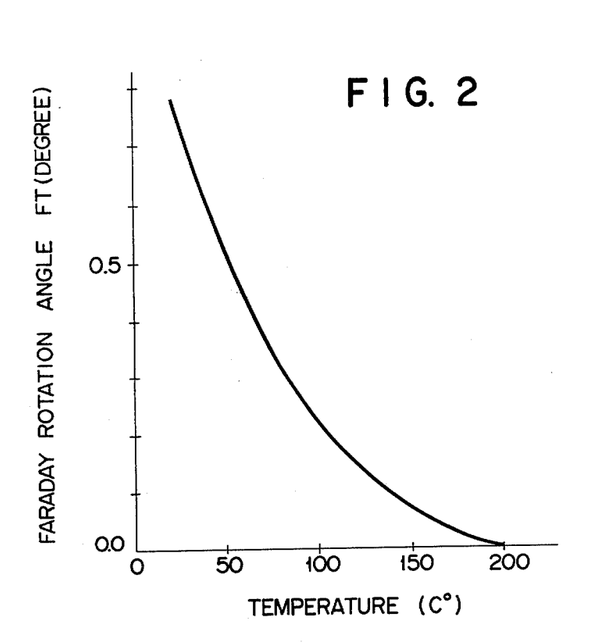
FIG. 2 is a graph showing the relationship between temperatures and Faraday rotation angles of the thin film of FIG. 1.

FIG. 2 shows the relationship between temperatures and magnetization of the thin film used in FIG. 1 (Sample 16) in terms of Faraday rotation angles Ft determined by using 6328 Å wavelength of laser beam. It is seen that the Curie point of the film was 187° C., which is about half the value of a thin film of a Mn-Bi two element system.

In the sample used in FIG. 2, the vanishing of spontaneous magnetization due to temperature elevation is caused by secondary magnetic transition. Thus, an abrupt vanishing of spontaneous magnetization caused by primary crystal transition from a low temperature phase to high temperature phase as seen in a film of a Mn-Bi system is not seen in FIG. 2. Further, the sample was free from an increasing phenomenon of magnetization accompanying the relaxation to a low temperature phase, which is observed in a quenched high temperature phase of a Mn-Bi two element system.

Figure 3:
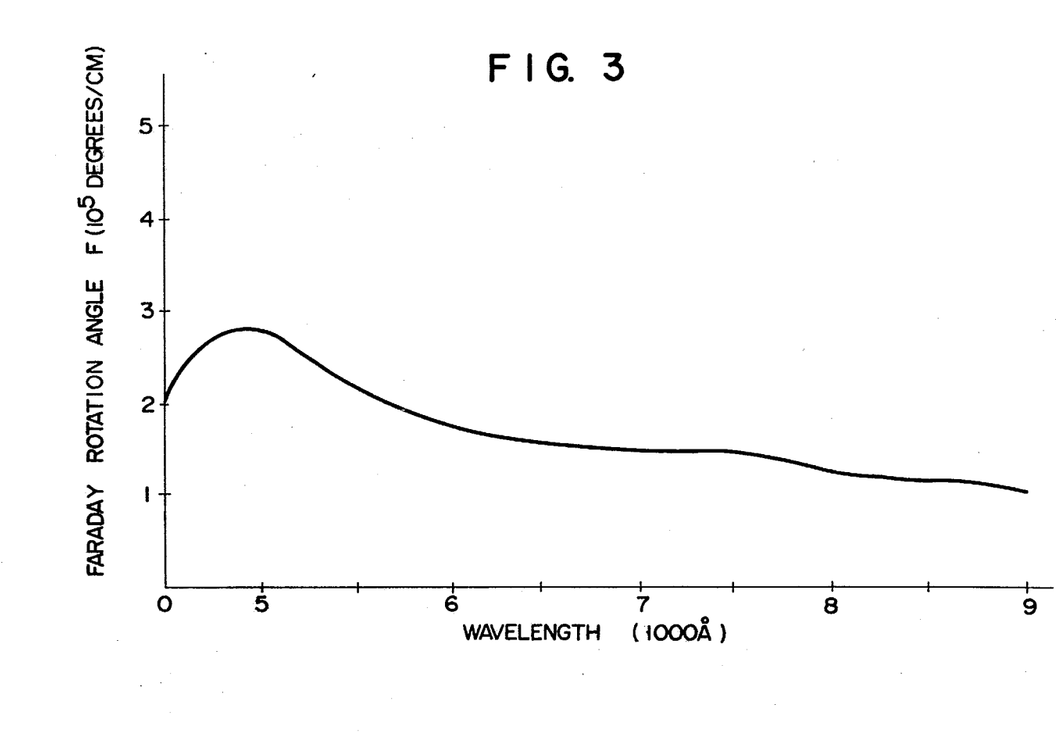
FIG. 3 is a graph of Faraday rotation angles of the thin film of FIG. 1 against wavelengths of laser beams.

FIG. 3 shows the Faraday rotation angles F for unit thickness of film relative to wavelengths of laser beams used for determination of F. The test was conducted on sample 16 (same as for FIG. 1) under residual magnetization state.

Figure 4:
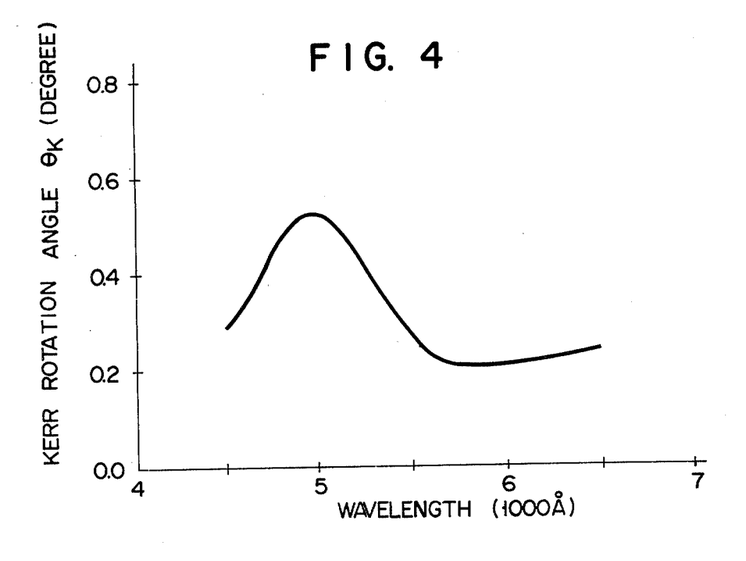
FIG. 4 is a graph of Kerr rotation angles of the film of FIG. 1 against wavelengths of laser beams.

FIG. 4 shows the relationship between the Kerr rotation angle $\theta_k$ and wavelengths of laser beams used for $\theta_k$ determination. The experiment was applied to sample 16 under residual magnetization state as for FIG. 3 and the values of $\theta_k$ were measured from the glass substrate side of the sample. It is seen that the maximum $\theta_k$ was reached around 5000 Å of wavelength.

Figure 5:
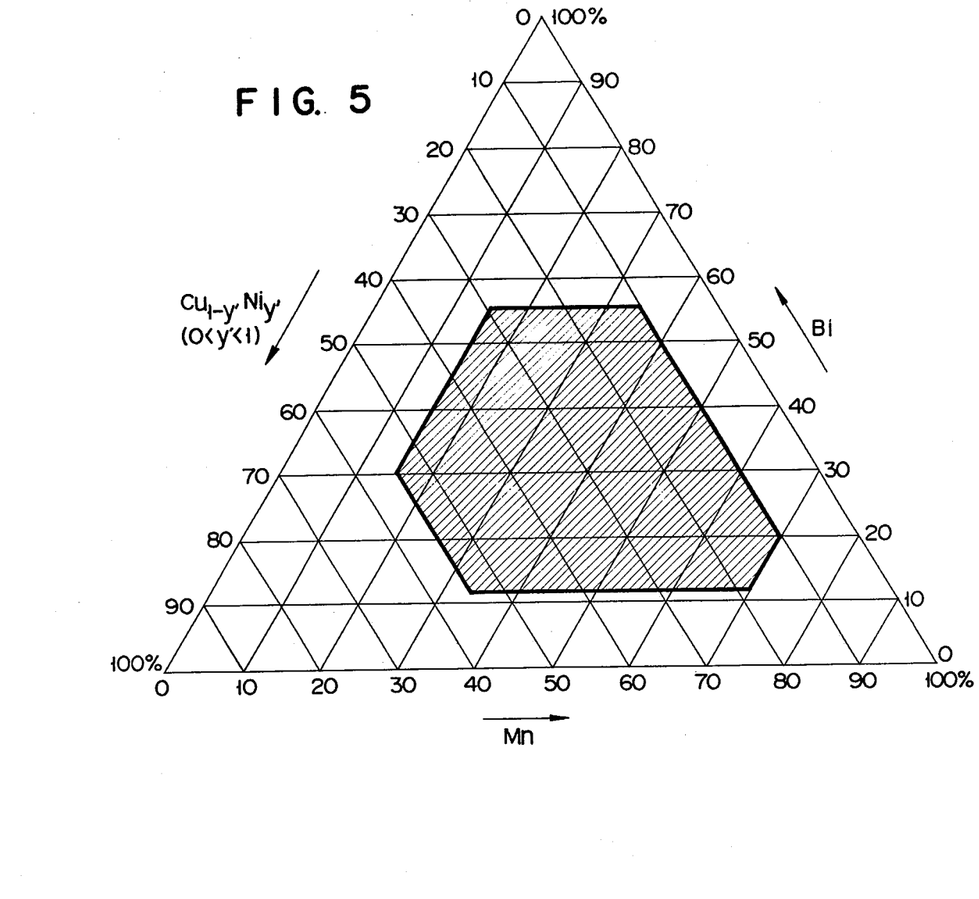
FIG. 5 shows the range of compositions of a magneto-optic thin film of this invention.

Finally, FIG. 5 is a triangular coordinate showing the compositions of a magneto-optic thin film of a four element system of Mn-Cu-Ni-Bi specified in the present invention. The composition falling outside the hatched region fails to attain a single phase crystal system. For example, the composition containing a predominant amount of Bi, namely, the uppermost region of the triangular coordinate, gives a mixed phase of hexagonal phase and cubic phase, the hexagonal phase being presented by an excessive Bi content. Said mixed phase is also present around the region of $Mn_{0.5}Bi_{0.5}$, i.e., around the center of the line connecting the Mn 100% point and the Bi 100% point (MnBi is responsible for the problem). On the other hand, the composition of the region along the line connecting the Bi 100% point and $Cu_{1-y'}Ni_{y'}$ 100% point presents such a crystal phase, not cubic phase, as to present a diffraction line of $2\theta = 17.5°$ when subjected to X-ray diffraction using Cu-K$\alpha$ rays, "$\theta$" representing black angle. Further, a phase of $2\theta = 31.2°$ (not cubic phase) is observed in the composition of the region near the Mn 100% point. If the compositions fall within the hatched region of the triangular coordinate, the thin film bears a single phase of cubic system, has a Curie point of 100 to 200° C., exhibits satisfactory magneto-optic properties and magnetic hysteresis characteristics and is extremely stable against humidity. The compositions falling within the hatched region are defined by the formula $$Mn_x(Cu_{1-y'}Ni_{y'})_y Bi_z$$

wherein $x+y+z=1$, $0.15 \leq x \leq 0.70$, $0.10 \leq y \leq 0.55$, $0.11 \leq z \leq 0.55$, and y' is from 0.11 to 0.95.

Preferred compositions are those in which:

$$0.20 \leq x \leq 0.55,$$

$$0.15 \leq y \leq 0.45,$$

$$0.13 \leq z \leq 0.43,$$

wherein y', Ni, is from 0.11 to 0.95 and Cu is from 0.89 to 0.05.

What we claim is:

1. A magneto-optic thin film on a substrate for memory devices, said film consisting essentially a composition defined by the formula $$Mn_x(Cu_{1-y'}Ni_{y'}) Bi_z$$

wherein $X+y+z=1$, $0.15 \leq x \leq 0.70$, $0.10 \leq y \leq 0.55$, $0.11 \leq z \leq 0.55$, and y' is from 0.11 to 0.95.

2. The magneto-optic thin film according to claim 1, wherein $0.20 \leq x \leq 0.55$, $0.15 \leq y \leq 0.45$ and $0.13 \leq z \leq 0.43$.

3. A magneto-optic thin film on a substrate for memory devices, said film consisting essentially of Mn, Cu, Ni, Bi and a fifth element, said Mn, Cu, Ni and Bi having the relationship defined by the formula $$Mn_x(Cu_{1-y'}Ni_{y'})Bi_z$$

wherein $x+y+z=1$, $0.15 \leq x \leq 0.70$, $0.10 \leq y \leq 0.55$, $0.11 \leq z \leq 0.55$, and $y'$ is from 0.11 to 0.95, and said fifth element is selected from the group consisting of Ti, V, Cr, Fe, Nb, Te, Y, Ce, Nd, Gd and Dy.

4. The magneto-optic thin film according to claim 3, wherein said fifth element is selected from the group consisting of Ti, V, Cr, Fe and Nb, and is in an amount of 0.035 mol per mol of said composition.

5. The magneto-optic thin film according to claim 3, wherein said fifth element is selected from the group consisting of Ti, V, Cr, Fe and Nb, and is in an amount of 0.07 mol per mol of said composition.

6. The magneto-optic thin film according to claim 3, wherein said fifth element is selected from the group consisting of Y, Ce, Nd, Gd and Dy, and is in an amount of 0.075 mol per mol of said composition.

7. The magneto-optic thin film according to claim 3, wherein said fifth element is selected from the group consisting of Y, Ce, Nd, Gd and Dy, and is in an amount of 0.15 mol per mol of said composition.

8. The magneto-optic thin film according to claim 3, wherein said fifth element is Te in an amount of 0.03 mol per mol of said composition.

9. The magneto-optic thin film according to claim 3, wherein said fifth element is Te in an amount of 0.06 mol per mol of said composition.

10. A magneto-optic thin film on a substrate for memory devices, said film consisting essentially of Mn, Cu, Ni, Bi and a fifth element, said Mn, Cu, Ni and Bi having the relationship defined by the formula $$Mn_x(Cu_{1-y'}Ni_{y'})Bi_z$$

wherein $x+y+z=1$, $0.15 \leq x \leq 0.70$, $0.10 \leq y \leq 0.55$, $0.11 \leq z \leq 0.55$, and $y'$ is from 0.11 to 0.95, and said fifth element is selected from the group consisting of Co, Pd and Rh.

11. The magneto-optic thin film according to claim 10, wherein said fifth element is Co in an amount of 0.07 mol per mol of said composition.

12. The magneto-optic thin film according to claim 10, wherein said fifth element is Pd in an amount of 0.14 mol per mol of said composition.

13. The magneto-optic thin film according to claim 10, wherein said fifth element is Rh in an amount of 0.07 mol per mol of said composition.

* * * * *

UNITED STATES PATENT AND TRADEMARK OFFICE
CERTIFICATE OF CORRECTION

PATENT NO. : 4,170,689
DATED : October 9, 1979
INVENTOR(S) : AKINORI KATSUI et al It is certified that error appears in the above-identified patent and that said Letters Patent are hereby corrected as shown below:

Column 4, Table 1, in the heading: replace "Magneto-optic Figure of Merit Degree 2F/d" with ---Magneto-optic Figure of Merit Degree $2F/\alpha$---.

Column 6, Table 2, Sample No. 61: should read ---$Mn_{0.38}(Cu_{0.60}Ni_{0.40})\ldots$---.

Column 8, line 59 (Claim 1): after "essentially", insert ---of---.

Column 9, line 8, (Claim 3): should read ---$Mn_x(Cu_{1-y'}Ni_{y'})Bi_z$---.

Signed and Sealed this

Tenth Day of June 1980

[SEAL]

*Attest:*

*Attesting Officer*

SIDNEY A. DIAMOND
*Commissioner of Patents and Trademarks*